United States Patent
Mahabadi

[11] Patent Number: 5,510,735
[45] Date of Patent: Apr. 23, 1996

[54] COMPARATOR CIRCUIT FOR GENERATING A CONTROL SIGNAL CORRESPONDING TO A DIFFERENCE VOLTAGE BETWEEN A BATTERY VOLTAGE AND A POWER SUPPLY VOLTAGE

[75] Inventor: John K. Mahabadi, Tempe, Ariz.

[73] Assignee: Motorola, Inc., Schaumburg, Ill.

[21] Appl. No.: 368,408

[22] Filed: Dec. 29, 1994

[51] Int. Cl.⁶ .................................................... H03K 5/22
[52] U.S. Cl. ............................. 327/77; 327/87; 327/80; 327/436
[58] Field of Search .................................. 327/50, 51, 63, 327/64, 65, 66, 67, 68, 77, 530, 534, 78, 80, 436, 563; 340/663

[56] References Cited

U.S. PATENT DOCUMENTS

| | | | |
|---|---|---|---|
| 4,394,587 | 7/1983 | McKenzie et al. | 327/68 |
| 4,511,810 | 4/1985 | Yukawa | 327/63 |
| 4,598,215 | 1/1986 | Schechtman et al. | 327/65 |
| 4,658,157 | 4/1987 | McGowan | 327/65 |
| 5,180,930 | 1/1993 | Mayes | 327/63 |
| 5,289,054 | 2/1994 | Lucas | 327/63 |
| 5,311,071 | 5/1994 | Ueda | 327/63 |
| 5,341,034 | 8/1994 | Matthews | 327/63 |

Primary Examiner—Tomothy P. Callahan
Assistant Examiner—Kenneth B. Wells
Attorney, Agent, or Firm—Gary W. Hoshizaki

[57] ABSTRACT

A comparator circuit (31) for sensing a voltage difference between a battery voltage and a power supply voltage is coupled to a switch (39). The comparator circuit is capable of accurately sensing a voltage near the power supply voltage. The comparator circuit (31) comprises a first amplification stage (32–36), a second amplification stage (37), and a Schmitt trigger (38). The first amplification stage (32–36) includes a first source follower (32) and a second source follower (33) for generating a differential voltage corresponding to a difference voltage between the battery voltage and the power supply voltage. The first amplification stage (32–36) reduces problems in amplifying voltage near the power supply voltage by level shifting the voltage through the use of source followers and insuring transistors operate in a saturation region of operation. The second amplification stage (37) further amplifies the difference voltage between the battery voltage and the power supply voltage. The Schmitt trigger (38) provides a logic signal for controlling the switch (39).

10 Claims, 1 Drawing Sheet

5,510,735

COMPARATOR CIRCUIT FOR GENERATING A CONTROL SIGNAL CORRESPONDING TO A DIFFERENCE VOLTAGE BETWEEN A BATTERY VOLTAGE AND A POWER SUPPLY VOLTAGE

BACKGROUND OF THE INVENTION

This invention relates, in general, to comparators, and more particularly, to a comparator for enabling a switch that provides either a power supply voltage or a battery voltage.

Many circuits require a battery backup to provide power when a power supply voltage cannot be provided. Power from either a battery or a power supply is coupled through a switch to a circuit. The switch is controlled by a comparator that compares the battery voltage against the power supply voltage. The comparator provides a logic signal to the switch that decouples the power supply from the circuit and couples the battery to the circuit when the power supply voltage is less than the battery voltage.

In general, battery backup is critical for insuring that data is not lost or an orderly shutdown of the circuitry occurs after power is removed. Coupling the inputs of a comparator to a power supply voltage may severely degrade comparator performance. The input voltage to the comparator affects internal voltages of the comparator which can reduce gain or in the extreme case cause the comparator to be non-functional. A comparator used to control a switch must be capable of operating under these extreme input conditions due to the critical nature of its function.

It would be of great benefit if a comparator could be provided having inputs that can be coupled to a power supply voltage without degradation in performance.

DETAILED DESCRIPTION OF THE DRAWINGS

In general, an alternate power source is provided to power a circuit when a main power source is removed or fails. The alternate power source is used to maintain operation of the circuit, provide power for an orderly shutdown of the circuit, or to place the circuit in a low power mode of operation to retain information stored in memory. The main power source and the alternate power source are coupled to the circuit through a switch. Under normal operating conditions the switch couples the main power source to the circuit. The switch is switched to couple the alternate power source to the circuit if a voltage of the main power source has a voltage magnitude less than the alternate power source.

Figure 1:
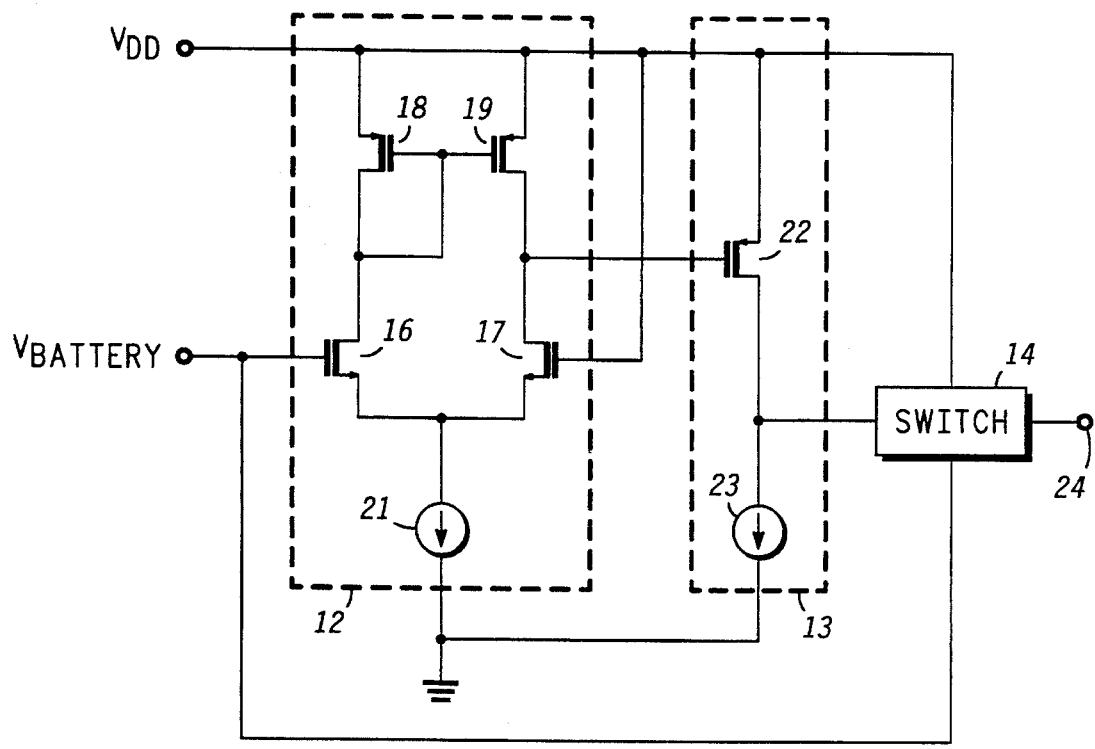
FIG. 1 is a schematic diagram of a prior art comparator circuit.

FIG. 1 is a prior art schematic diagram of a comparator 11 coupled to a switch 14 for providing either a power supply voltage $V_{DD}$ or a battery voltage $V_{BATTERY}$ at an output 24 of switch 14. Comparator 11 is a well known circuit for amplifying a differential voltage and providing a single-ended output voltage. Comparator 11 comprises an input stage 12 and an amplification stage 13. Input stage 12 of comparator 11 has a first input coupled to receive the battery voltage $V_{BATTERY}$ and a second input coupled to receive the power supply voltage $V_{DD}$. An output of input stage 12 couples to an input of output stage 13. An output of amplification stage 13 couples to a control input of switch 14. Comparator 11 amplifies a voltage difference between the power supply voltage $V_{DD}$ and the battery voltage $V_{BATTERY}$ and generates a logic signal for controlling switch 14. The logic signal provided by comparator 11 determines which voltage ($V_{DD}$ or $V_{BATTERY}$) couples to output 24 of switch 14.

Input stage 12 of comparator 11 comprises transistors 16, 17, 18, and 19, and current source 21. Transistors 16 and 17 form a differential transistor pair for receiving an input voltage. Transistors 18 and 19 form a current mirror circuit. Current source 21 biases the differential transistor pair and the current mirror circuit.

Output stage 13 of comparator 11 comprises transistor 22 and current source 23. Output stage 13 amplifies a signal provided by input stage 12. A gate of transistor 22 receives the signal from input stage 12 and provides an amplified signal corresponding to a logic signal at its drain.

Switch 14 couples either the power supply voltage $V_{DD}$ or the battery voltage $V_{BATTERY}$ to output 24. Switch 24 includes a first input coupled for receiving the power supply voltage, a second input coupled for receiving the battery voltage, a control input coupled to amplification stage 13 of comparator 11, and output 24. Under normal operating conditions the power supply voltage $V_{DD}$ is greater than the battery voltage $V_{BATTERY}$. Comparator 11 provides a logic one level to the control input of switch 14 which couples the power supply voltage $V_{DD}$ to output 24. Comparator 11 generates a logic zero level when the power supply voltage $V_{DD}$ has a voltage magnitude less than the voltage magnitude of the batter voltage $V_{BATTERY}$. Switch 14 couples the battery voltage $V_{BATTERY}$ to output 24 upon receiving the logic zero level from comparator 11.

The input voltages applied to comparator 11 ($V_{BATTERY}$ and $V_{DD}$) severely reduce the drain to source voltage of transistors 16 and 17. For example, assume the power supply voltage and the battery voltage is 5.0 volts, transistors 18 and 19 have a gate to source voltage of 1.3 volts, and transistors 16 and 17 have a gate to source voltage of 1.5 volts under quiescent operating conditions. The voltage at a drain of transistors 16 and 17 is approximately (5.0 volts–1.3 volts) 3.7 volts. The voltage at a source of transistors 16 and 17 is approximately (5 volts–1.5 volts) 3.5 volts. The drain to source voltage of transistors 16 and 17 under these conditions is approximately 200 millivolts. The small drain to source voltage is due to the fact that the voltage across the two series devices (transistors 16 and 18 or transistors 17 and 19) is not shared equally across each device. Transistors 16 and 17 are biased in a linear region of operation which reduces the gain of input stage 12. Thus, comparator 11 has reduced sensitivity to changes in the power supply voltage that could impact the switching of switch 14. An input stage having inputs that can be coupled to a power supply voltage or battery voltage with all transistors in a saturation region would be desirable to insure accurate switching.

Figure 2:
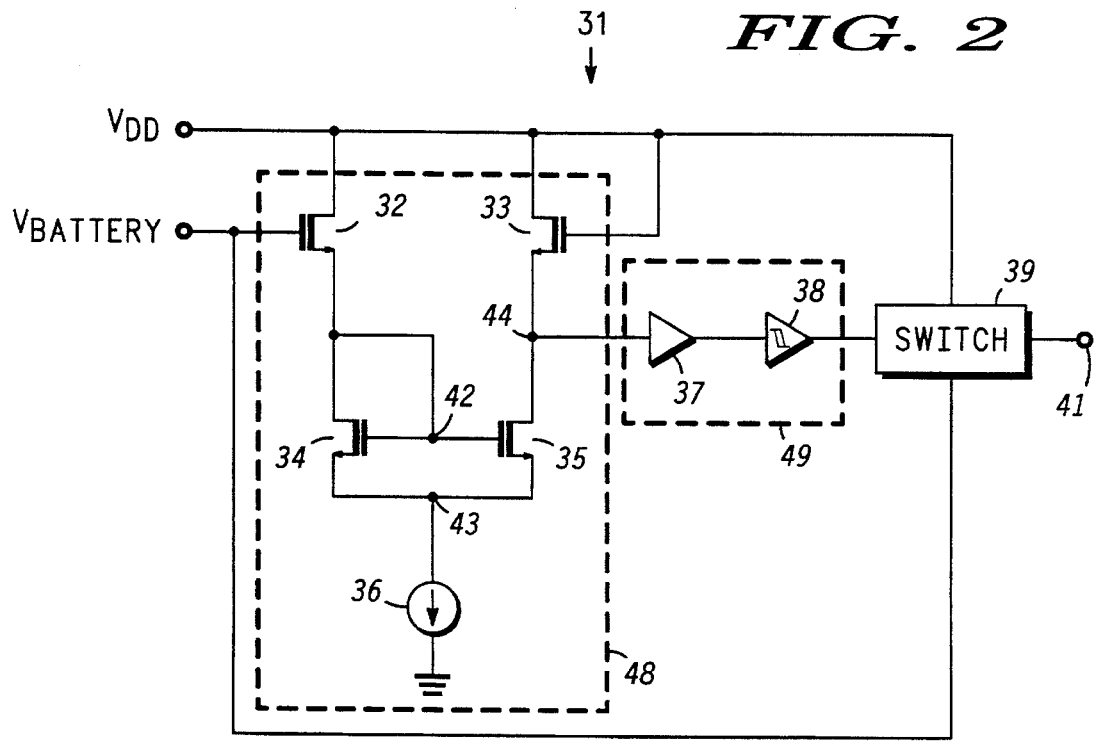
FIG. 2 is a schematic diagram of a comparator circuit in accordance with the present invention.

FIG. 2 is a schematic diagram of a comparator 31 and a switch 39. Comparator 31 comprises an input stage 48 and an amplification stage 49. The transistors of input stage 48 operate in the saturation region. Comparator 31 has a first input coupled for receiving a power supply voltage $V_{DD}$, a second input coupled for receiving a battery voltage $V_{BATTERY}$, and an output for providing a logic signal.

Input stage 48 amplifies a voltage difference between the power supply voltage $V_{DD}$ and the battery voltage $V_{BATTERY}$. Input stage 48 comprises transistors 32, 33, 34, 35, and current source 36. Transistors 32–35 are of the same conductivity type and each has a drain, gate, and source, respectively corresponding to a first electrode, control electrode, and second electrode. In the preferred embodiment, transistors 32–35 are n-channel enhancement metal oxide semiconductor field effect transistors (MOSFETs). An amplified signal is provided at a node 44 of input stage 48.

Transistor 32 has a drain coupled for receiving the power supply voltage $V_{DD}$, a gate coupled for receiving the battery voltage $V_{BATTERY}$, and a source coupled to a node 42. Transistor 33 has a drain and a gate coupled in common for receiving the power supply voltage $V_{DD}$, and a source coupled to node 44. Transistor 34 has a drain and gate coupled in common to node 42, and a source coupled to a node 43. Transistor 35 has drain coupled to node 44, a gate coupled to node 42, and a source coupled to node 43. Current source 36 biases transistors 32–35 and has a first terminal coupled to node 43 and a second terminal coupled for receiving a power supply voltage (e.g. ground).

In the preferred embodiment, transistor 32 is configured as source followers. Transistor 32 follows the battery voltage $V_{BATTERY}$ and provides a corresponding voltage at node 42. Transistor 33 is in a diode configuration having its gate and drain coupled in common. Transistor 33 acts as an active load for transistor 35. Transistors 34 and 35 form a current mirror circuit for producing a current change corresponding to a voltage difference between the power supply voltage $V_{DD}$ and the battery voltage $V_{BATTERY}$.

In the preferred embodiment, transistors 32 and 33 are matched (having identical areas) and transistors 34 and 35 are matched. Transistors 32–35 operate in the MOSFET saturation region. For example, assume the power supply voltage $V_{DD}$ and the battery voltage $V_{BATTERY}$ (under quiescent conditions) is 5.0 volts, the gate to source voltage of transistors 32–35 is 1.5 volts, and the threshold voltage of transistors 32–35 is 1.0 volt. The definition for operation in the saturation region of a MOSFET is when $V_{DS} > (V_{GS} - V_T)$, where $V_{DS}$ is the drain to source voltage, $V_{GS}$ is the gate to source voltage, and $V_T$ is the threshold voltage of the MOSFET. The voltage at node 42 and 44 is (5.0 volts–1.5 volts) approximately 3.5 volts. The voltage at node 43 is (3.5 volts–1.5 volts) approximately 2.0 volts. Note that each transistor meets the criteria for operation in the saturation region.

The current mirror formed by transistors 34 and 35 forces an equal current through transistors 32 and 33. The voltage at nodes 42 and 44 are identical when the battery voltage equals the power supply voltage since the voltage drop across transistors 32 and 33 are the same. In the preferred embodiment, the power supply voltage $V_{DD}$ is greater than the battery voltage $V_{BATTERY}$ causing the voltage at node 42 to be less than the voltage at node 44. Conversely, if the power supply voltage $V_{DD}$ falls below the battery voltage $V_{BATTERY}$, the voltage at node 42 will be greater than the voltage at node 44.

Amplification stage 49 amplifies the voltage at node 44 of input stage 48 and provides a corresponding logic signal at the output of Schmitt trigger 38. Amplification stage 49 comprises an amplifier stage 37 and a Schmitt trigger 38. Amplification stage 37 has an input coupled to node 44 and an output. An inverter or an output stage such as output stage 13 of FIG. 1 is suitable for amplification stage 37. Schmitt trigger 38 is an amplification stage having hysteresis for reducing jitter at the output of comparator 31 when the power supply voltage $V_{DD}$ and the battery voltage $V_{BATTERY}$ are approximately the same voltage. The hysteresis is a predetermined threshold that must be overcome for its output to change logic state.

Amplification stage 49 provides a logic one level at the output of Schmitt trigger 38 when the voltage at node 44 is greater than the voltage at node 42 and provides a logic zero level at the output of Schmitt trigger 38 when the voltage at node 44 is less than the voltage at node 42. The output of Schmitt trigger 38 couples to the control input of switch 39.

Switch 39 couples either the power supply voltage $V_{DD}$ or the battery voltage $V_{BATTERY}$ to an output 41. Switch 39 has a first input coupled for receiving the power supply voltage $V_{DD}$, a second input coupled for receiving the battery voltage $V_{BATTERY}$, a control input coupled to the output of Schmitt trigger 38, and the output 41. In a normal mode of operation, comparator 31 provides a logic one level to the control input of switch 39. The normal mode of operation corresponds to a condition where the power supply voltage $V_{DD}$ is greater than the battery voltage $V_{BATTERY}$. Switch 39 couples the power supply voltage $V_{DD}$ to output 41. If the power supply voltage $V_{DD}$ fails or is turned off, it will trigger comparator 31 to provide a logic zero level when the power supply voltage $V_{DD}$ is less than the battery voltage $V_{BATTERY}$. The logic zero level decouples the power supply voltage $V_{DD}$ from output 41 and couples the battery voltage $V_{BATTERY}$ to output 41.

By now it should be appreciated that a comparator has been provided for sensing a voltage difference between a power supply voltage and a battery voltage. The comparator includes an input stage comprising transistors of the same conductivity type configured such that each transistor operates in the saturation region of device operation. A Schmitt trigger is used in the comparator as an amplification stage which reduces jitter at the comparator output when the power supply voltage and battery voltage are at similar voltages.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

I claim:

1. A comparator circuit comprising:

a first transistor having a first electrode for receiving a first power supply voltage, a control electrode for receiving an input signal, and a second electrode wherein said first transistor is configured as a voltage follower;

a second transistor having a first electrode and a control electrode coupled in common to said second electrode of said first transistor, and a second electrode;

a third transistor having a first electrode and a control electrode coupled in common for receiving said first power supply voltage, and a second electrode;

a fourth transistor having a first electrode coupled to said second electrode of said third transistor, a control electrode coupled to said control electrode of said second transistor, and a second electrode coupled to said second electrode of said second transistor; and a current source having a first terminal coupled to said second electrode of said second transistor and a second terminal for receiving a second power supply voltage, the comparator amplifying a voltage difference between said input signal and said first power supply voltage.

2. The comparator circuit of claim 1 further including:

an amplification stage having an input coupled to said second electrode of said third transistor and an output.

3. The comparator circuit of claim 2 further including:
a Schmitt trigger having an input coupled to said output of said amplification stage and an output for providing an amplified signal corresponding to a difference voltage between said first power supply voltage and said input signal.

4. The comparator circuit of claim 1 wherein said first, second, third, and fourth transistors are of a same conductivity type.

5. The comparator circuit of claim 1 wherein said first and third transistors have identical conductive areas for having similar operating characteristics.

6. The comparator circuit of claim 1 wherein said second and fourth transistors have identical conductive areas for having similar operating characteristics.

7. A comparator circuit for controlling a switch that couples a battery and a power supply to a circuit, the comparator circuit comprising:

a first transistor having a first electrode for receiving a first power supply voltage, a control electrode for receiving a battery voltage, and a second electrode wherein said first transistor is configured as a voltage follower;

a second transistor having a first electrode and a control electrode coupled in common to said second electrode of said first transistor, and a second electrode;

a third transistor having a first electrode and a control electrode coupled in common for receiving said first power supply voltage, and a second electrode;

a fourth transistor having a first electrode coupled to said second electrode of said third transistor, a control electrode coupled to said control electrode of said second transistor, and a second electrode coupled to said second electrode of said second transistor;

a current source having a first terminal coupled to said second electrode of said second transistor and a second terminal for receiving a second power supply voltage;

an amplification stage having an input coupled to said second electrode of said second transistor and an output;

a Schmitt trigger having an input coupled to said output of said amplification stage and an output; and the switch having a first input for receiving said first power supply voltage, a second input for receiving said battery voltage, a control input coupled to said output of said Schmitt trigger, and an output coupled to the circuit wherein the comparator circuit enables the switch to couple said first power supply voltage to the circuit when said first power supply voltage is greater than said battery voltage and wherein the comparator circuit enables the switch to couple said battery voltage to the circuit when said battery voltage is greater than said first power supply voltage.

8. The circuit of claim 7 wherein said first, second, third, and fourth transistors are of a same conductivity type.

9. The circuit of claim 7 wherein said first and third transistors have conductive areas identical to one another for having similar operating characteristics.

10. The circuit of claim 7 wherein said second and fourth transistors have conductive areas identical to one another for having similar operating characteristics.

* * * * *